US010606327B2

(12) United States Patent
Chiriac et al.

(10) Patent No.: US 10,606,327 B2
(45) Date of Patent: Mar. 31, 2020

(54) HEAT REDUCTION USING SELECTIVE INSULATION AND THERMAL SPREADING

(71) Applicant: QUALCOMM Incorporated, San Diego, CA (US)

(72) Inventors: Victor Chiriac, Phoenix, AZ (US); Jorge Rosales, San Diego, CA (US); Peng Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/624,877

(22) Filed: Jun. 16, 2017

(65) Prior Publication Data

US 2018/0368279 A1 Dec. 20, 2018

(51) Int. Cl.
| | |
|---|---|
| *H05K 7/20* | (2006.01) |
| *H01L 23/367* | (2006.01) |
| *G06F 1/20* | (2006.01) |
| *G03B 17/55* | (2006.01) |

(52) U.S. Cl.
CPC ............... *G06F 1/203* (2013.01); *G06F 1/20* (2013.01); *H01L 23/367* (2013.01); *H05K 7/20445* (2013.01); *H05K 7/20963* (2013.01)

(58) Field of Classification Search
CPC .......... H05K 7/20454; H05K 7/20463; H05K 7/20472; H05K 7/209; H05K 7/20845; H05K 7/2089; H05K 7/2039–20518; H05K 1/0201–0204; H01L 23/36–3675; G06F 1/20; G03B 17/55
USPC ...... 361/707, 704, 709, 713; 165/80.1–80.2; 257/712–713, 717, 719; 174/547–548
See application file for complete search history.

(56) References Cited

U.S. PATENT DOCUMENTS

| | | | |
|---|---|---|---|
| 9,128,685 B2* | 9/2015 | Choi | G06F 1/203 |
| 9,301,429 B2 | 3/2016 | Zhang et al. | |
| 9,374,932 B2 | 6/2016 | Hwang | |
| 2005/0270746 A1* | 12/2005 | Reis | G06F 1/203 |
| | | | 361/708 |
| 2011/0194255 A1* | 8/2011 | Yamashita | B23K 1/0016 |
| | | | 361/711 |
| 2011/0303393 A1* | 12/2011 | Senatori | G06F 1/203 |
| | | | 165/104.33 |
| 2012/0318484 A1 | 12/2012 | Hirasawa | |
| 2014/0118951 A1* | 5/2014 | Hsu | H05K 1/0206 |
| | | | 361/717 |

(Continued)

FOREIGN PATENT DOCUMENTS

| | | |
|---|---|---|
| CN | 105072868 A | 11/2015 |
| CN | 204993472 U | 1/2016 |

OTHER PUBLICATIONS

International Search Report and Written Opinion—PCT/US2018/034840—ISA/EPO—dated Sep. 4, 2018.

*Primary Examiner* — Zachary Pape
*Assistant Examiner* — Amir A Jalali
(74) *Attorney, Agent, or Firm* — Muncy, Geissler, Olds & Lowe, P.C.

(57) ABSTRACT

Techniques for heat reduction are disclosed. An apparatus may include a heat-generating component, an insulative layer having a first surface in contact with the heat-generating component and a second surface opposite the first surface, and a heat-conducting component disposed on the second surface of the insulative layer.

26 Claims, 5 Drawing Sheets

(56) References Cited

U.S. PATENT DOCUMENTS

| | | | |
|---|---|---|---|
| 2015/0130045 A1* | 5/2015 | Tseng | H01L 23/36 257/712 |
| 2016/0042967 A1* | 2/2016 | Fanelli | H01L 21/28008 257/347 |
| 2016/0282914 A1* | 9/2016 | Saito | H05K 7/20336 |
| 2017/0003723 A1* | 1/2017 | Jun | G06F 1/203 |
| 2017/0097665 A1* | 4/2017 | Jenkins | H05K 7/20436 |
| 2017/0181268 A1* | 6/2017 | Chiu | H05K 1/0203 |
| 2017/0207205 A1* | 7/2017 | Kim | H01L 21/4857 |
| 2017/0273183 A1* | 9/2017 | Kawasaki | H05K 1/18 |
| 2017/0287825 A1* | 10/2017 | Lee | H01L 23/49827 |
| 2017/0309541 A1* | 10/2017 | Kim | H01L 23/3675 |

* cited by examiner

HEAT REDUCTION USING SELECTIVE INSULATION AND THERMAL SPREADING

INTRODUCTION

Aspects of this disclosure relate generally to heat reduction in a device, and more particularly to techniques for using selective insulation and/or thermal spreading to reduce heat.

As electronic components have become smaller and less expensive, increasingly small devices have been designed to include increasing numbers of components. These electronic components may generate heat, especially when activated for long periods of time. As devices become more densely packed with heat-generating components, heat accumulation may occur.

Heat accumulation can impact the performance and/or lifespan of the device. For example, heat can cause a processor or memory to slow or malfunction. Moreover, the skin of the device may reach such temperature as to endanger the user of the device. The skin of the device may comprise all outer surfaces of the device, for example, an enclosure of the device, a touch screen, etc.

Certain portions of the skin of the device may be in greater danger of heat accumulation, due to their proximity to one or more heat-generating components. These portions of the skin of the device maybe referred to as hot spots. The peak localized surface temperature of the device, or a portion thereof, may refer to the hottest hot spot.

New approaches are needed for reducing heat accumulation, in particular, for reducing peak localized surface temperature of the device, or a portion thereof.

SUMMARY

The following summary is an overview provided solely to aid in the description of various aspects of the disclosure and is provided solely for illustration of the aspects and not limitation thereof.

In one example, an apparatus is disclosed. The apparatus may include, for example, a heat-generating component, an insulative layer having a first surface in contact with the heat-generating component and a second surface opposite the first surface, and a heat-conducting component disposed on the second surface of the insulative layer.

In another example, a method for making an apparatus is disclosed. The method may include, for example, providing a heat-generating component, disposing a first surface of an insulative layer in contact with the heat-generating component, the insulative layer further comprising a second surface opposite the first surface, and disposing a heat-conducting component on the second surface of the insulative layer.

In yet another example, an apparatus is disclosed. The apparatus may include, for example, means for generating heat, means for insulating having a first surface in contact with the means for generating heat and a second surface opposite the first surface, and means for conducting heat disposed on the second surface of the means for insulating.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an", and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

As used herein, it will be understood that terms such as "top" and "bottom", "left" and "right", "vertical" and "horizontal", "length", "width", and "thickness", etc., are used strictly in relation to one another, and do not express or imply any relation with respect to gravity, a manufacturing device used to manufacture the components described herein, or to some other device to which the components described herein are coupled, mounted, etc.

In a three-dimensional rectangular device, the length, width, and thickness may be defined orthogonally to one another. The thickness may be defined as the smallest dimension of the device. The thickness may be substantially less than the length and/or the width, for example, less than ten percent of the length and/or width. The thickness may be parallel to a vertical direction, and the length and width may be parallel to a horizontal dimension. Lateral movement may refer to movement along the horizontal dimension, along the length and/or width of the device.

Figure 1:
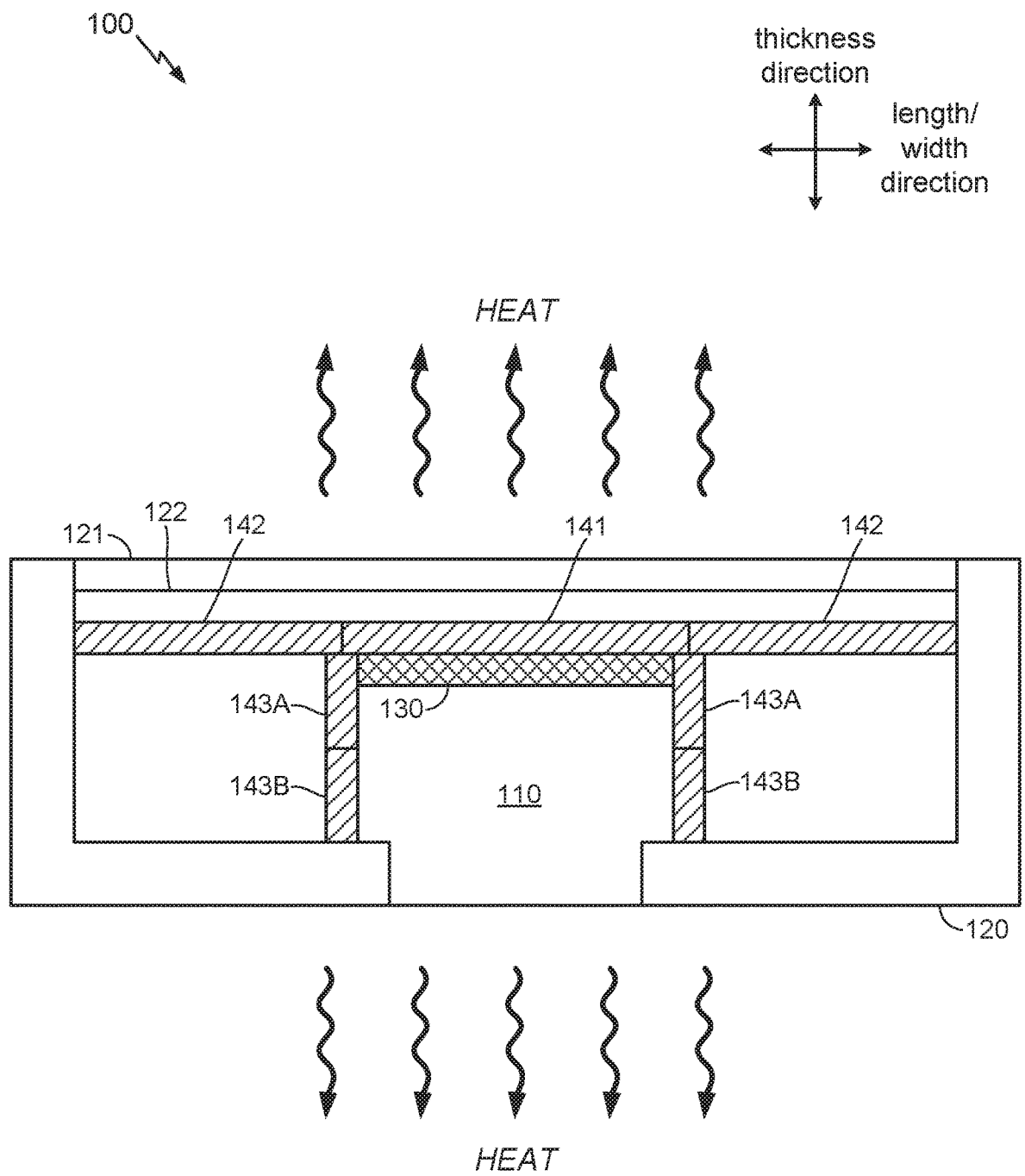
FIG. 1 generally illustrates a side view of a wireless device having an insulative layer and heat-conducting component in accordance with aspects of the disclosure.

FIG. 1 generally illustrates a side view of a wireless device 100 having an insulative layer 130 and a heat-conducting portion 140 in accordance with aspects of the disclosure. Also labeled are a "thickness" direction (top to bottom in FIG. 1) and a "length/width" direction (left to right in FIG. 1). As noted above, these terms are used strictly in relation to one another, and do not express or imply any relation with respect to gravity, a manufacturing device used to manufacture the components described herein, or to some other device to which the components described herein are coupled, mounted, etc.

The wireless device 100 may include a heat-generating component 110. In FIG. 1, the heat-generating component 110 is depicted as a camera, however, it will be understood that the heat-generating component 110 may be any component that generates heat, for example, a processor, memory, or battery. The heat-generating component 110 may be cylindrical, like the camera depicted in FIG. 1. However, it will be understood that the heat-generating component may be any suitable shape.

The wireless device 100 may include an enclosure 120. It will be understood that FIG. 1 is not drawn to scale. Accordingly, the enclosure 120 may have a length and/or a width that are substantially greater than a thickness of the enclosure 120. For example, the thickness of the enclosure 120 may be less than ten percent of the length and/or the width. The heat-generating component 110, the insulative layer 130, and the heat-conducting portion 140 may be disposed in the enclosure 120.

In FIG. 1, the heat-generating component 110 depicted as a camera, extends into the bottom surface of the enclosure 120. However, it will be understood that according to other aspects of the disclosure, the heat-generating component 110 may be contained entirely within the enclosure 120.

The enclosure 120 may include a LCD cover 121 and a LCD substrate 122, wherein LCD stands for liquid crystal display. The LCD cover 121 may be considered a portion of the enclosure 120 and may constitute an outer surface of the enclosure 120.

The heat-conducting portion 140 may comprise a heat-conducting component first portion 141, a heat-conducting component second portion 142, and a heat-conducting component third portion 143. As shown in FIG. 1, the heat-conducting component third portion 143 may be divided into two subportions, for example, a first subportion 143A and a second subportion 143B. However, it will be understood that other arrangements may be suitable and that the heat-conducting component third portion 143 may not be divided into subportions, or alternatively, may be divided into more than two subportions. Moreover, it will be further understood that the dividing line between the first subportion 143A and the second subportion 143B may be, for example, vertical rather than horizontal, such that the heat-conducting component third portion 143 is split into two semicylinders.

The reference numeral 140, as used in the present disclosure, refers generally to a group of components including the heat-conducting component first portion 141, the heat-conducting component second portion 142, and the heat-conducting component third portion 143. Although the heat-conducting component first portion 141, the heat-conducting component second portion 142, and the heat-conducting component third portion 143 are depicted in FIG. 1 as being distinct components, it will be understood that in accordance with aspects of the disclosure, the heat-conducting component first portion 141, the heat-conducting component second portion 142, and/or the heat-conducting component third portion 143 may simply be identifiable parts of a single, unitary heat-conducting portion 140. The heat-conducting portion 140 may comprises any suitable material or combination of materials, for example, copper and graphite. In some implementations, each of the heat-conducting component first portion 141, the heat-conducting component second portion 142, and the heat-conducting component third portion 143 may comprise the same material or combination of materials. In other implementations, one or more of the heat-conducting component first portion 141, the heat-conducting component second portion 142, and the heat-conducting component third portion 143 may comprise different materials or combinations of materials.

The heat-conducting component first portion 141 may have a length that is substantially similar to a length of the heat-generating component 110. The heat-conducting component first portion 141 may also have a width that is substantially similar to a width of the heat-generating component 110. The heat-conducting component first portion 141 may have an area that is substantially similar to an area of the heat-generating component 110. The area of a component may refer to the length of the component multiplied by the width of the component. As used herein, a first component that is substantially similar to a second component may be defined being no more than ten percent larger than the second component and no less than ten percent smaller than the second component.

The heat-conducting component second portion 142 may be in contact with the heat-conducting component first portion 141. The heat-conducting component second portion 142 may extend laterally from the heat-conducting component first portion 141, i.e., in a length direction and/or a width direction. In some implementations, the heat-conducting component second portion 142 may extend laterally across a length that is substantially similar to the length of the enclosure 120. Additionally or alternatively, the heat-conducting component second portion 142 may extend laterally across a width that is substantially similar to the width of the enclosure 120. A thickness of the heat-conducting component second portion 142 may be substantially similar to a thickness of the heat-conducting component first portion 141.

The heat-conducting component third portion 143 may be in contact with the heat-conducting component first portion 141. The heat-conducting component third portion 143 may extend in a thickness direction from the heat-conducting component first portion 141. In some implementations, the heat-conducting component third portion 143 may surround at least a portion of the heat-generating component 110. In some implementations, the heat-conducting component third portion 143 may be in contact with the heat-generating component 110. For example, an inner dimension (e.g., a diameter) of the heat-conducting component third portion 143 may be substantially similar to an outer dimension of the heat-generating component 110.

The insulative layer 130 may be disposed between the heat-generating component 110 and the heat-conducting component first portion 141. An outer dimension (e.g., a diameter) of the insulative layer 130 may be substantially similar to an inner dimension of the heat-conducting component third portion 143. The insulative layer 130 may have a thickness that is, for example, 0.75 millimeters. The insulative layer 130 may comprise cotton wool or any other suitable insulative material.

Testing has shown that continuous use of a camera, such as is depicted in FIG. 1, may result in a peak localized surface temperature, or hot spot, on the skin of the wireless device 100. The peak localized surface temperature may be located on a portion of the enclosure 120 that surrounds the heat-generating component 110. Additionally or alternatively, the peak localized surface temperature may be located on a portion of the LCD cover 121 that is adjacent the heat-generating component 110.

Testing has further shown that the peak localized surface temperature can be reduced in accordance with the techniques of the present disclosure. The insulative properties of the insulative layer 130 and the heat-spreading properties of the heat-conducting portion 140 may combine to achieve reductions in peak localized surface temperature. For example, results show that the peak localized surface temperature of the portion of the enclosure 120 that surrounds the heat-generating component 110 may be reduced by 2.6 degrees Celsius, and that the peak localized surface temperature of the portion of the LCD cover 121 that is adjacent the heat-generating component 110 may be reduced by 5.0 degrees Celsius.

Figure 2:
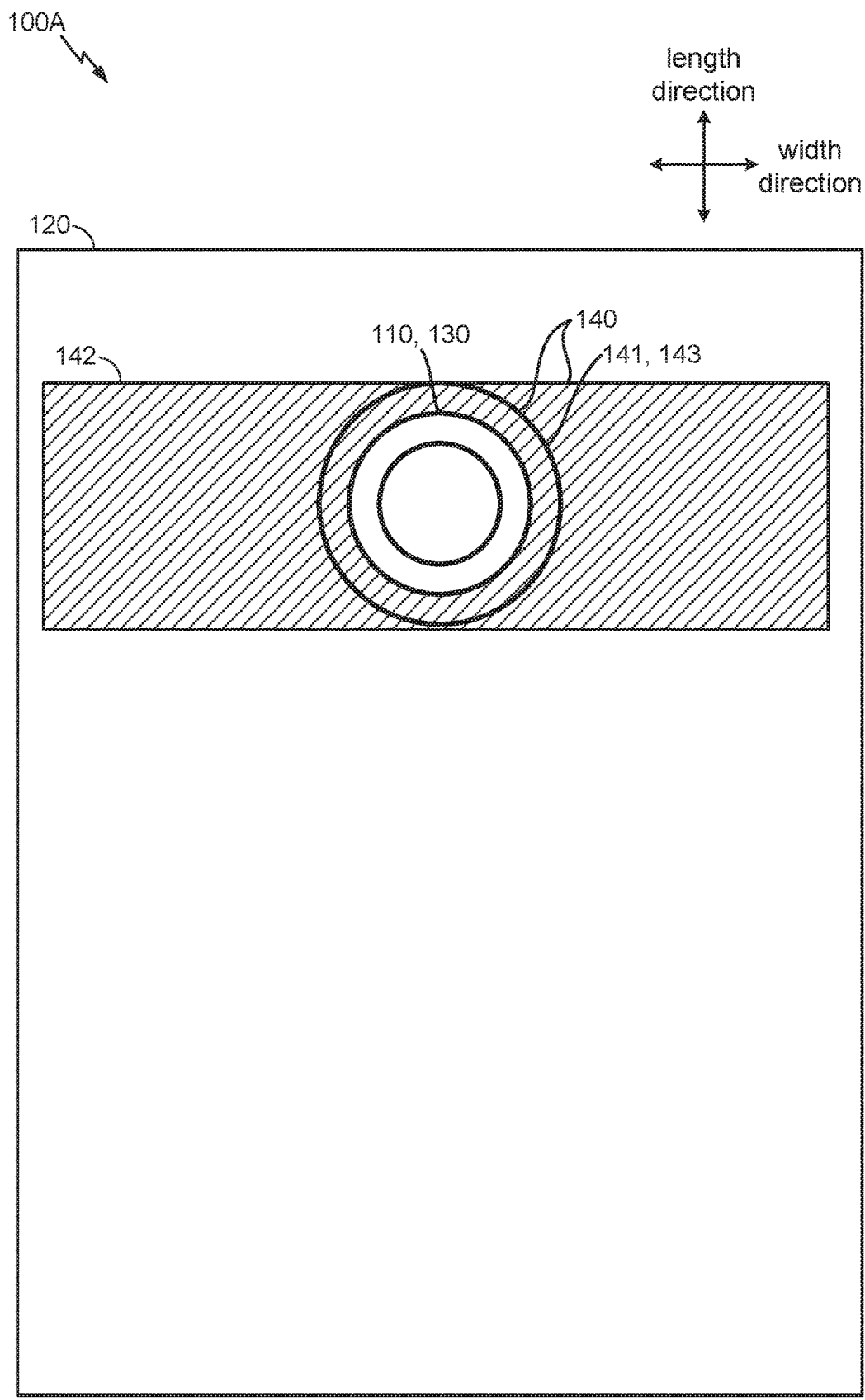
FIG. 2 generally illustrates a rear view of a wireless device in accordance with aspects of the disclosure.
Figure 3:
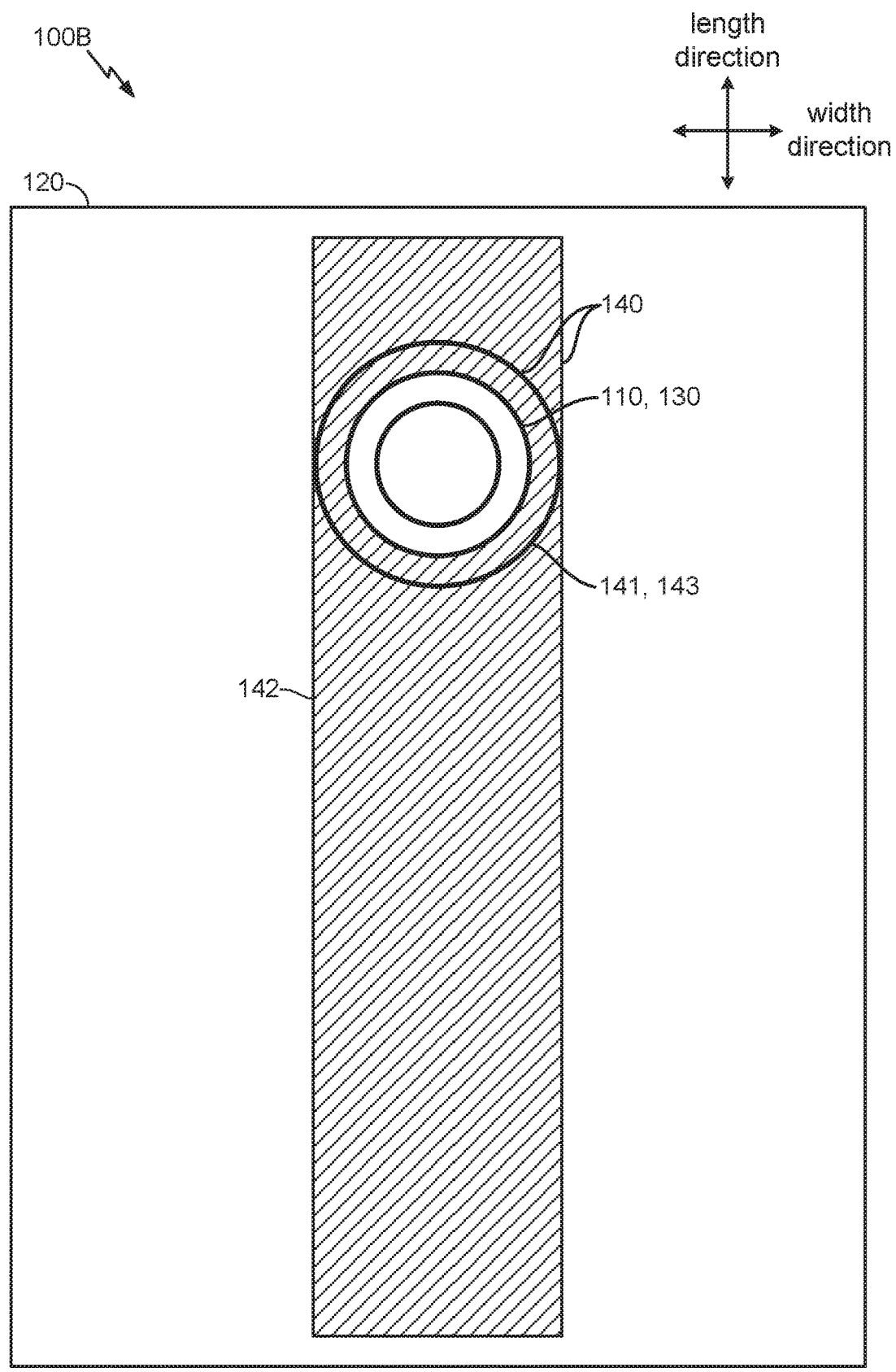
FIG. 3 generally illustrates a rear view of a wireless device in accordance with other aspects of the disclosure.
Figure 4:
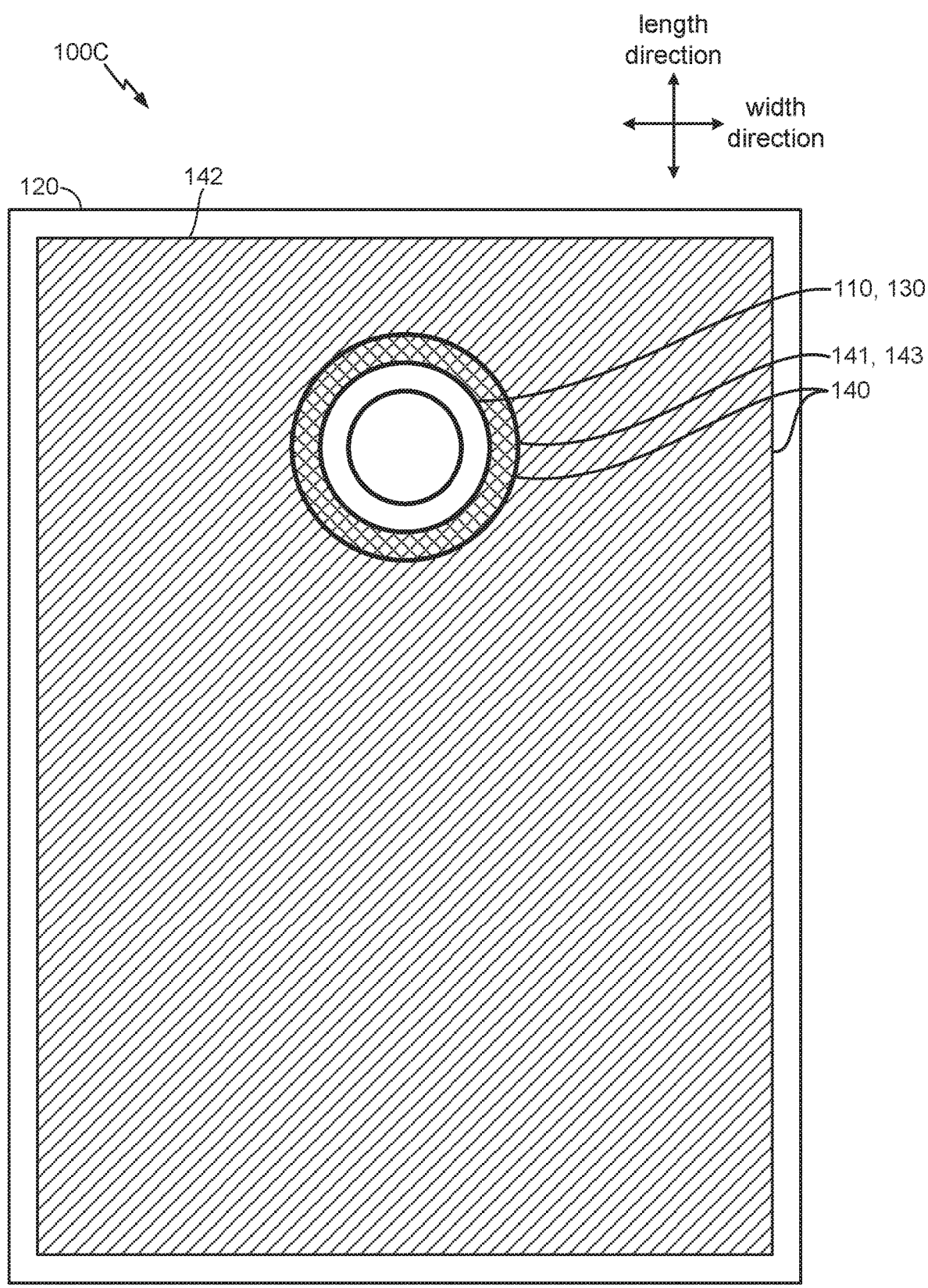
FIG. 4 generally illustrates a rear view of a wireless device in accordance with yet other aspects of the disclosure.

FIG. 2 generally illustrates a rear view of a wireless device 100A in accordance with aspects of the disclosure. FIG. 3 generally illustrates a rear view of a wireless device 100B in accordance with other aspects of the disclosure. FIG. 4 generally illustrates a rear view of a wireless device 100C in accordance with yet other aspects of the disclosure. The commonalties of FIGS. 2-4 will be briefly discussed before proceeding to a discussion of the specific features thereof.

The wireless devices 100A, 100B, and 100C may be alternate implementations of the wireless device 100, and each may be similar, from a side view, to the wireless device 100 depicted in FIG. 1. In each of FIGS. 2-4, cross-sections of the wireless devices 100A, 100B, and 100C are depicted from a direction in which a lens of the camera is pointed. In each of FIGS. 2-4, a length direction extends from the top of the figure to the bottom of the figure, and a width direction extends from the left of the figure to the right of the figure. Although the lengths of the wireless devices 100A, 100B, and 100C are depicted as being somewhat greater than their respective widths, it will be understood that other arrangements are possible in accordance with aspects of the disclosure.

The heat-conducting component third portion 143 is depicted in FIGS. 2-4 as a ring-shaped portion. As will be understood from the foregoing discussion of FIG. 1, the heat-conducting component third portion 143 may extend in a thickness direction from a periphery of the heat-conducting component first portion 141. The position of the heat-conducting component first portion 141 is indicated in FIGS. 2-4. It will be understood that from the cross-sectional perspective of FIGS. 2-4, the shape and/or area of the heat-conducting component first portion 141 may be substantially similar to the shape and/or area of the heat-generating component 110 and/or the heat-conducting component third portion 143. Moreover, the heat-conducting component first portion 141 itself may be concealed beneath the heat-generating component 110 and/or the heat-conducting component third portion 143.

As will be understood from a comparison of FIGS. 2-4, the heat-conducting component second portion 142 may be implemented in different ways. In FIG. 2, the wireless device 100A includes a heat-conducting component second portion 142 that extends laterally in a width direction from the heat-conducting component first portion 141. Accordingly, the heat-conducting component second portion 142 may have a length that is substantially similar to a length of the heat-conducting component first portion 141 and a width that is substantially similar to a width of the enclosure 120.

In FIG. 3, the wireless device 100B includes a heat-conducting component second portion 142 that extends laterally in a length direction from the heat-conducting component first portion 141. Accordingly, the heat-conducting component second portion 142 may have a width that is substantially similar to a width of the heat-conducting component first portion 141 and a length that is substantially similar to a length of the enclosure 120.

In FIG. 4, the wireless device 100C includes a heat-conducting component second portion 142 that extends laterally in a length direction and a width direction from the heat-conducting component first portion 141. Accordingly, the heat-conducting component second portion 142 may have a length that is substantially similar to a length of the enclosure 120 and a width that is substantially similar to a width of the enclosure 120.

Other implementations are possible, and it will be understood that the heat-conducting component second portion 142 may extend at any distance and in either or both directions from the heat-conducting component first portion 141. In some implementations, the heat-conducting component second portion 142 may cover at least half of an area of the enclosure 120. In other implementations, the area of the heat-conducting component second portion 142 may be substantially similar to the area of the enclosure 120. As noted above, the area of a component is defined by the length of the component multiplied by the width of the component.

In view of the descriptions and explanations above, one skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

For example, means for generating heat may be a heat-generating component (for example, the heat-generating component 110 depicted in FIGS. 1-4). Means for insulating may be an insulative layer (for example, the insulative layer 130 depicted in FIGS. 1-4). Means for conducting heat may be a heat-conducting portion (for example, the heat-conducting portion 140 comprising a heat-conducting component first portion 141, a heat-conducting component second portion 142, and a heat-conducting component third portion 143 as depicted in FIGS. 1-4). Means for enclosing may be an enclosure (for example, the enclosure 120 depicted in FIGS. 1-4).

Figure 5:
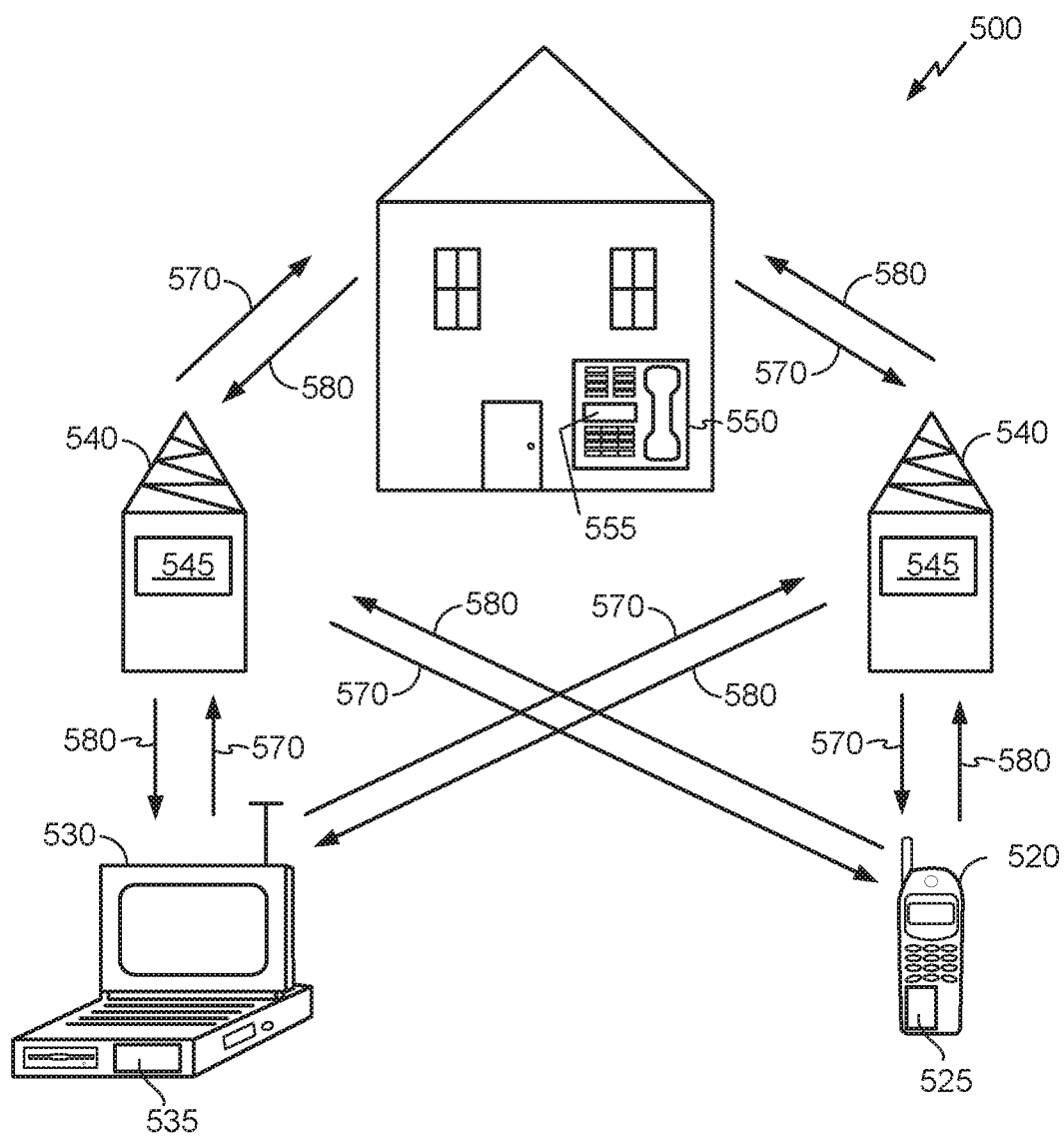
FIG. 5 generally illustrates a wireless communication system in which an aspect of the disclosure may be advantageously employed.

FIG. 5 generally illustrates a wireless communication system 500 in which an aspect of the disclosure may be advantageously employed. For purposes of illustration, FIG.

5 shows three remote units 520, 530, and 550 and two base stations 540. It will be recognized that wireless communication systems may have many more remote units and base stations. Remote units 520, 530, and 550 include IC devices 525, 535 and 555, as disclosed below. The base stations 540 may also include IC devices 545. It will be recognized that any device containing an IC may also include heat-conducting components having the disclosed features and/or components manufactured by the processes disclosed here, including the base stations, switching devices, and network equipment. FIG. 5 shows forward link signals 580 from the base station 540 to the remote units 520, 530, and 550 and reverse link signals 570 from the remote units 520, 530, and 550 to base stations 540.

In FIG. 5, the remote unit 520 is shown as a mobile telephone, the remote unit 530 is shown as a portable computer, and the remote unit 550 is shown as a fixed location remote unit in a wireless local loop system. For example, remote units may be a device such as a music player, a video player, an entertainment unit, a navigation device, a communications device, a personal digital assistant (PDA), a fixed location data unit, and a computer. Although FIG. 5 illustrates remote units according to the teachings of the disclosure, the disclosure is not limited to these exemplary illustrated units. The disclosure may be suitably employed in any device which includes semiconductor components, as described below.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

While the foregoing disclosure shows illustrative aspects of the disclosure, it should be noted that various changes and modifications could be made herein without departing from the scope of the invention as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus comprising:
   a heat-generating component;
   an insulative layer having a first surface in contact with the heat-generating component and a second surface opposite the first surface;
   a heat-conducting component disposed on the second surface of the insulative layer, wherein the heat-conducting component includes:
      a first portion that is in contact with the second surface of the insulative layer, wherein the first portion has a length and a width that are substantially similar to a length and a width of the heat-generating component; and
      a second portion extending laterally in plane from the first portion in a length direction and width direction;
      a third portion extending in a thickness direction from the first portion;
   wherein the first portion of the heat-conducting component and the second portion of the heat-conducting component are coplanar, and the second portion extends laterally in plane past the third portion in a same plane as the first portion; and
   an enclosure wherein the heat-generating component, the insulative layer, and the heat-conducting component are disposed in the enclosure, and the second portion has a length and a width that are substantially similar to a length and width of the enclosure.

2. The apparatus of claim 1, wherein the insulative layer has a length and a width that are substantially similar to a length and a width of the heat-generating component.

3. The apparatus of claim 1, wherein the third portion is in contact with the first portion.

4. The apparatus of claim 3, wherein the length and width of the enclosure are substantially greater than a thickness of the enclosure.

5. The apparatus of claim 3, wherein the second portion is configured to laterally spread heat generated by the heat-generating component.

6. The apparatus of claim 3, wherein the third portion is in contact with the heat-generating component.

7. The apparatus of claim 6, wherein a part of the third portion that is in contact with the heat-generating component surrounds at least a portion of the heat-generating component.

8. The apparatus of claim 1, wherein the apparatus is incorporated into a set top box, a music player, a video player, an entertainment unit, a navigation device, a communications device, a personal digital assistant (PDA), a fixed location data unit, or a computer, or any combination thereof.

9. A method for making an apparatus comprising:
   providing a heat-generating component;
   disposing a first surface of an insulative layer in contact with the heat-generating component, the insulative layer further comprising a second surface opposite the first surface;
   disposing a heat-conducting component on the second surface of the insulative layer, wherein the heat-conducting component includes:
      a first portion that is in contact with the second surface of the insulative layer, wherein the first portion has a length and a width that are substantially similar to a length and a width of the heat-generating component; and
      a second portion extending laterally in plane from the first portion in a length direction and width direction;
      a third portion extending in a thickness direction from the first portion;
   wherein the first portion of the heat-conducting component and the second portion of the heat-conducting component are coplanar, and the second portion extends laterally in plane past the third portion in a same plane as the first portion; and
   providing an enclosure wherein the heat-generating component, the insulative layer, and the heat-conducting component are disposed in the enclosure, and the second portion has a length and a width that are substantially similar to a length and width of the enclosure.

10. The method of claim 9, wherein the insulative layer has a length and a width that are substantially similar to a length and a width of the heat-generating component.

11. The method of claim 9, wherein disposing the heat-conducting component further includes disposing the third portion of the heat-conducting component in contact with the first portion.

12. The method of claim 11, wherein the length and width of the enclosure are substantially greater than a thickness of the enclosure.

13. The method of claim 11, further comprising laterally spreading heat generated by the heat-generating component using the second portion of the heat-conducting component.

14. The method of claim 11, wherein disposing the third portion of the heat-conducting component comprises disposing the third portion of the heat-conducting component in contact with the heat-generating component.

15. The method of claim 14, wherein disposing the third portion of the heat-conducting component comprises disposing a part of the third portion that is in contact with the heat-generating component so as to surround at least a portion of the heat-generating component.

16. The method of claim 9, further comprising incorporating the apparatus into a set top box, a music player, a video player, an entertainment unit, a navigation device, a communications device, a personal digital assistant (PDA), a fixed location data unit, or a computer, or any combination thereof.

17. An apparatus comprising:
   means for generating heat;
   means for insulating having a first surface in contact with the means for generating heat and a second surface opposite the first surface;
   means for conducting heat disposed on the second surface of the means for insulating, wherein the means for conducting heat includes:
      a first portion that is in contact with the second surface of the means for insulating, wherein the first portion has a length and a width that are substantially similar to a length and a width of the means for generating heat; and
      a second portion extending laterally in plane from the first portion in a length direction and width direction;
      a third portion extending in a thickness direction from the first portion;
   wherein the first portion of the means for conducting heat and the second portion of the heat-conducting component are coplanar, and the second portion extends laterally in plane past the third portion in a same plane as the first portion; and
   means for enclosing wherein the means for conducting heat, the means for insulating, and the means for generating heat are disposed in the means for enclosing, and the second portion has a length and a width that are substantially similar to a length and width of the means for enclosing.

18. The apparatus of claim 17, wherein the means for insulating has a length and a width that are substantially similar to a length and a width of the means for generating heat.

19. The apparatus of claim 17, wherein the length and width of the means for enclosing are substantially greater than a thickness of the means for enclosing.

20. The apparatus of claim 17, wherein the second portion is configured to laterally spread heat generated by the means for generating heat.

21. The apparatus of claim 17, wherein the third portion is in contact with the means for generating heat.

22. The apparatus of claim 21, wherein a part of the third portion that is in contact with the means for generating heat surrounds at least a portion of the means for generating heat.

23. The apparatus of claim 17, wherein the apparatus is incorporated into a set top box, a music player, a video player, an entertainment unit, a navigation device, a communications device, a personal digital assistant (PDA), a fixed location data unit, or a computer, or any combination thereof.

24. The apparatus of claim 1, wherein the apparatus is a wireless device and the heat-generating component is selected from the group consisting of a camera, a memory, and a battery.

25. The apparatus of claim 3, wherein the thickness direction is perpendicular to the length direction and width direction.

26. The apparatus of claim 3, wherein the third portion is a ring-shaped portion.

* * * * *